United States Patent
Fujita

(10) Patent No.: US 11,024,519 B2
(45) Date of Patent: Jun. 1, 2021

(54) SUBSTRATE PROCESSING APPARATUS, SUBSTRATE PROCESSING METHOD AND COMPUTER READABLE RECORDING MEDIUM

(71) Applicant: TOKYO ELECTRON LIMITED, Minato-ku (JP)

(72) Inventor: Akira Fujita, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 117 days.

(21) Appl. No.: 15/873,091

(22) Filed: Jan. 17, 2018

(65) Prior Publication Data

US 2018/0204745 A1 Jul. 19, 2018

(30) Foreign Application Priority Data

Jan. 17, 2017 (JP) ............................. JP2017-005771

(51) Int. Cl.
*H01L 21/67* (2006.01)
*H01L 21/02* (2006.01)
(Continued)

(52) U.S. Cl.
CPC .......... *H01L 21/67051* (2013.01); *B08B 3/02* (2013.01); *B08B 3/08* (2013.01);
(Continued)

(58) Field of Classification Search
CPC ......... H01L 21/67051; H01L 21/67028; H01L 21/02087; H01L 21/02052; B08B 3/10; B08B 3/08; B08B 3/02; B08B 2203/0229
See application file for complete search history.

(56) References Cited

U.S. PATENT DOCUMENTS

| 2003/0098048 A1* | 5/2003 | Kuroda | B08B 3/04 |
| | | | 134/32 |
| 2009/0181546 A1* | 7/2009 | Katoh | H01L 21/67063 |
| | | | 438/745 |

(Continued)

FOREIGN PATENT DOCUMENTS

| JP | H05-259060 A | 10/1993 |
| JP | 2013-128015 A | 6/2013 |

(Continued)

*Primary Examiner* — Benjamin L Osterhout
(74) *Attorney, Agent, or Firm* — Oblon, McClelland, Maier & Neustadt, L.L.P.

(57) ABSTRACT

A substrate processing apparatus includes a rotation holding device that holds and rotates a substrate, a liquid supply device including one or more rinse liquid nozzles that are positioned on back surface side of the substrate and supply rinse liquid to peripheral edge portion of back surface of the substrate, a cup that receives the liquid supplied to the substrate, and a control device including circuitry that controls the holding and supply devices. The nozzle is attached to the cup to receive the liquid, and the circuitry controls the holding and supply devices and executes first process in which the holding device varies rotation speed between first and second speeds, and the nozzle supplies the liquid to the peripheral edge portion of the back surface of the substrate such that the liquid cleans peripheral region of the nozzle in the cup and region on outer side of the peripheral region.

20 Claims, 7 Drawing Sheets

(51) Int. Cl.
*B08B 3/08* (2006.01)
*B08B 3/10* (2006.01)
*B08B 3/02* (2006.01)

(52) U.S. Cl.
CPC .......... *B08B 3/10* (2013.01); *H01L 21/02052* (2013.01); *H01L 21/02087* (2013.01); *H01L 21/67028* (2013.01); *B08B 2203/0229* (2013.01)

(56) References Cited

U.S. PATENT DOCUMENTS

2014/0090669 A1* 4/2014 Hinode ................. B08B 7/0071
134/19
2016/0064256 A1* 3/2016 Amano ............... H01L 21/6715
134/138

FOREIGN PATENT DOCUMENTS

| JP | 2013-211377 A | 10/2013 |
| JP | 2015-050213 A | 3/2015 |
| WO | WO 2008/041741 A | 4/2008 |

* cited by examiner

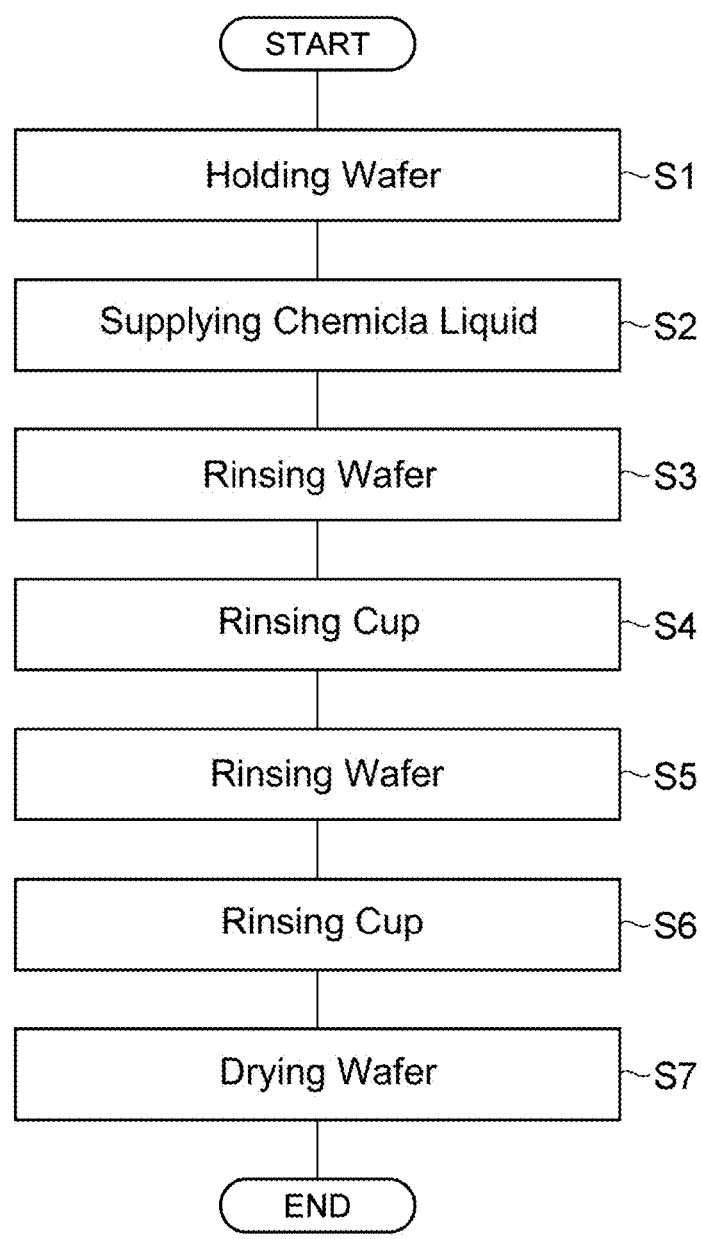

SUBSTRATE PROCESSING APPARATUS, SUBSTRATE PROCESSING METHOD AND COMPUTER READABLE RECORDING MEDIUM

CROSS-REFERENCE TO RELATED APPLICATIONS

The present application is based upon and claims the benefit of priority to Japanese Patent Application No. 2017-005771, filed Jan. 17, 2017, the entire contents of which are incorporated herein by reference.

BACKGROUND OF THE INVENTION

Field of the Invention

The present disclosure relates to a substrate processing apparatus, a substrate processing method and a computer readable recording medium.

Description of Background Art

When micro-fabrication of a substrate (for example, a semiconductor wafer) is performed, preliminary treatments of the substrate as an object to be processed are performed. As one of the preliminary treatments, Japanese Patent Laid-Open Publication No. 2013-128015 describes a liquid processing apparatus in which, by supplying various chemical liquids and rinse liquids to a peripheral edge portion of a substrate, adhered substances (for example, a resist film, contaminants, an oxide film and the like) adhering to the peripheral edge portion are removed (for example, etched). The apparatus includes a rotation driving part that holds and rotates the substrate, a nozzle that supplies a chemical liquid or a rinse liquid to the substrate, and a cup that surrounds the substrate held by the rotation driving part and receives the liquid supplied from the nozzle to the substrate. A drain hole is provided at a bottom of the cup, and the liquid received by the cup is discharged as drainage through the drain hole to outside of the apparatus. The entire contents of this publication are incorporated herein by reference.

SUMMARY OF THE INVENTION

According to one aspect of the present invention, a substrate processing apparatus includes a rotation holding device that holds and rotates a substrate, a liquid supply device including one or more rinse liquid nozzles that are positioned on a back surface side of the substrate and supply a rinse liquid to a peripheral edge portion of a back surface of the substrate, a cup device that receives the rinse liquid supplied from the rinse liquid nozzle to the substrate, and a control device including circuitry that controls the rotation holding device and the liquid supply device. The rinse liquid nozzle is attached to the cup device such that the cup device receives the rinse liquid supplied to the substrate, and the circuit of the control device controls the rotation holding device and the liquid supply device and executes a first process in which, in a state in which the substrate is positioned on an inner side of the cup device, the rotation holding device varies a rotation speed of the substrate between a first rotation speed and a second rotation speed that is different from the first rotation speed, and the rinse liquid nozzle supplies the rinse liquid to the peripheral edge portion of the back surface of the substrate such that the rinse liquid supplied to the back surface cleans a peripheral region of the rinse liquid nozzle in the cup device and a region on an outer side of the peripheral region in the cup device.

According to another aspect of the present invention, a substrate processing method includes holding a substrate with a rotation holding device that holds and rotates the substrate, and supplying a rinse liquid from a liquid supply device including one or more rinse liquid nozzles that are positioned on a back surface side of the substrate and supply the rinse liquid to a peripheral edge portion of a back surface of the substrate. The rinse liquid nozzle is attached to a cup device that receives the rinse liquid supplied from the rinse liquid nozzle to the substrate, and the supplying of the rinse liquid includes, in a state in which the substrate is positioned on an inner side of the cup device, rotating the substrate such that a rotation speed of the substrate is varied between a first rotation speed and a second rotation speed that is different from the first rotation speed, and supplying the rinse liquid from the rinse liquid nozzle attached to the cup device to the peripheral edge portion of the back surface of the substrate such that the rinse liquid supplied to the back surface of the substrate cleans a peripheral region of the rinse liquid nozzle in the cup device and a region on an outer side of the peripheral region in the cup device.

According to yet another aspect of the present invention, a non-transitory computer readable recording medium stored thereon a program that when executed by an information processing apparatus, the information processing apparatus executes a substrate processing method including holding a substrate with a rotation holding device that holds and rotates the substrate, and supplying a rinse liquid from a liquid supply device including one or more rinse liquid nozzles that are positioned on a back surface side of the substrate and supply the rinse liquid to a peripheral edge portion of a back surface of the substrate. The rinse liquid nozzle is attached to a cup device that receives the rinse liquid supplied from the rinse liquid nozzle to the substrate, and the supplying of the rinse liquid includes, in a state in which the substrate is positioned on an inner side of the cup device, rotating the substrate such that a rotation speed of the substrate is varied between a first rotation speed and a second rotation speed that is different from the first rotation speed, and supplying the rinse liquid from the rinse liquid nozzle attached to the cup device to the peripheral edge portion of the back surface of the substrate such that the rinse liquid supplied to the back surface of the substrate cleans a peripheral region of the rinse liquid nozzle in the cup device and a region on an outer side of the peripheral region in the cup device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a flowchart for describing rinse processing processes; and

DETAILED DESCRIPTION OF THE EMBODIMENTS

Figure 1:
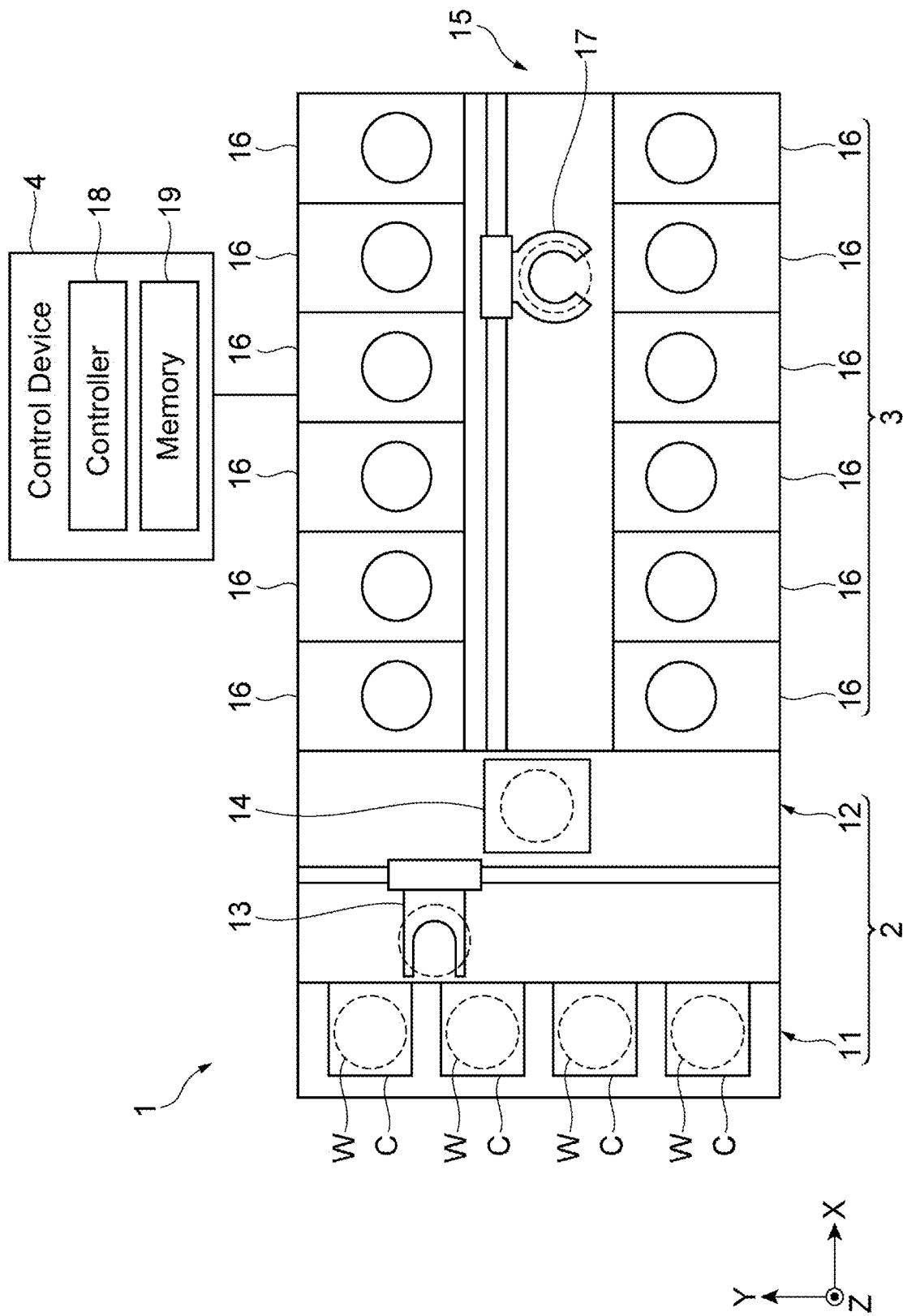
FIG. 1 is a plan view schematically illustrating a substrate processing system.

Embodiments will now be described with reference to the accompanying drawings, wherein like reference numerals designate corresponding or identical elements throughout the various drawings.

Substrate Processing System

FIG. 1 illustrates a schematic structure of a substrate processing system according to the present embodiment. In the following description, in order to clarify positional relationship, an X axis, a Y axis and a Z axis that are orthogonal to each other are defined, and the Z axis positive direction is defined as a vertical upward direction.

As illustrated FIG. 1, a substrate processing system 1 includes a loading and unloading station 2 and a processing station 3. The loading and unloading station 2 and the processing station 3 are provided adjacent to each other.

The loading and unloading station 2 includes a carrier mounting part 11 and a carrying part 12. Multiple carriers (C) accommodating multiple substrates (in the present embodiment, semiconductor wafers (hereinafter, referred to as wafers (W)) in a horizontal state are placed in the carrier mounting part 11.

The carrying part 12 is provided adjacent to the carrier mounting part 11 and includes therein a substrate carrying device 13 and a delivery part 14. The substrate carrying device 13 includes a wafer holding mechanism that holds a wafer (W). Further, the substrate carrying device 13 is capable of moving in a horizontal direction and a vertical direction and rotating about a vertical axis, and carries a wafer (W) between a carrier (C) and the delivery part 14 using the wafer holding mechanism.

The processing station 3 is provided adjacent to the carrying part 12. The processing station 3 includes a carrying part 15 and multiple processing units 16. The multiple processing units 16 are provided side by side on both sides of the carrying part 15.

The carrying part 15 includes therein a substrate carrying device 17. The substrate carrying device 17 includes a wafer holding mechanism that holds a wafer (W). Further, the substrate carrying device 17 is capable of moving in a horizontal direction and a vertical direction and rotating about a vertical axis, and carries a wafer (W) between the delivery part 14 and the processing units 16 using the wafer holding mechanism.

The processing units 16 each perform predetermined substrate processing with respect to a wafer (W) carried in by the substrate carrying device 17.

The substrate processing system 1 has a control device 4. The control device 4 is, for example, a computer, and includes a controller 18 and a memory 19. In the memory 19, a program that controls various processes to be executed in the substrate processing system 1 is stored. The controller 18 controls operation of the substrate processing system 1 by reading out and executing the program stored in the memory 19.

The program may be recorded in a computer readable memory medium and may be installed from the memory medium to the memory 19 of the control device 4. Examples of computer readable memory medium include a hard disk (HD), a flexible disk (FD), a compact disc (CD), a magnetic optical disc (MO), a memory card, and the like.

In the substrate processing system 1 structured as described above, first, the substrate carrying device 13 of the loading and unloading station 2 takes out a wafer (W) from a carrier (C) placed in the carrier mounting part 11 and places the taken out wafer (W) on the delivery part 14. The wafer (W) placed on the delivery part 14 is taken out from the delivery part 14 by the substrate carrying device 17 of the processing station 3 and is carried into a processing unit 16.

The wafer (W) carried into the processing unit 16 is processed by the processing unit 16, and is than carried out from the processing unit 16 by the substrate carrying device 17 and placed on the delivery part 14. Then, the processed wafer (W) placed on the delivery part 14 is returned to the carrier (C) of the carrier mounting part 11 by the substrate carrying device 13.

Substrate Processing Apparatus

A structure of a substrate processing apparatus 10 included in the substrate processing system 1 is described with reference to FIG. 2-5. The substrate processing apparatus 10 treats a wafer (W) (substrate), on a surface of which a film (F) is formed, as a processing object, and performs a process in which the film (F) is removed from a peripheral edge portion (Wc) (portion near a peripheral edge) of the wafer (W).

The wafer (W) may have a circular plate shape, or may have a shape other than a circular plate shape such as a polygonal plate shape. The wafer (W) may have a cutout portion formed by cutting out a portion of the wafer (W). The cutout portion may be, for example, a notch (a groove of a U shape, a V shape or the like), or a linear portion extending linearly (so-called orientation flat). The wafer (W) may be, for example, a semiconductor substrate, a glass substrate, a mask substrate, an FPD (Flat Panel Display) substrate and various other substrates. The wafer (W) may have a diameter of, for example, about 200 mm-450 mm. Specific examples of the film (F) include, for example, a TiN film, an Al film, a tungsten film, a SiN film, a SiO2 film, a polysilicon film, a thermal oxide film (Th-Ox), and the like.

The substrate processing apparatus 10 has the processing unit 16 and the control device 4 that controls the processing unit 16. The processing unit 16 has a rotation holding part 21, liquid supply parts (22-25), a temperature adjustment part 26, and a cup 27. Further, the processing unit 16 has an air blower (not illustrated in the drawings). Due to the air blower, a down flow is formed in the processing unit 16.

The rotation holding part 21 holds and rotates the wafer (W). The rotation holding part 21 has a holding part (21a) and a rotation driving part (21b). The holding part (21a) operates based on an operation signal from the control device 4 and holds, for example, a center portion of the wafer (W) by vacuum suction or the like. The rotation driving part (21b) is, for example, an actuator using an electric motor as a power source, and is connected to the holding part (21a). The rotation driving part (21b) operates based on an operation signal from the control device 4 and rotates the holding part (21a) about a rotation axis (Ax) extending along the vertical direction. That is, in a state in which the wafer (W) is in a substantially horizontal posture, the rotation holding part 21 rotates the wafer (W) about a axis (the rotation axis (Ax)) perpendicular to a surface (Wa) of the wafer (W).

Figure 3:
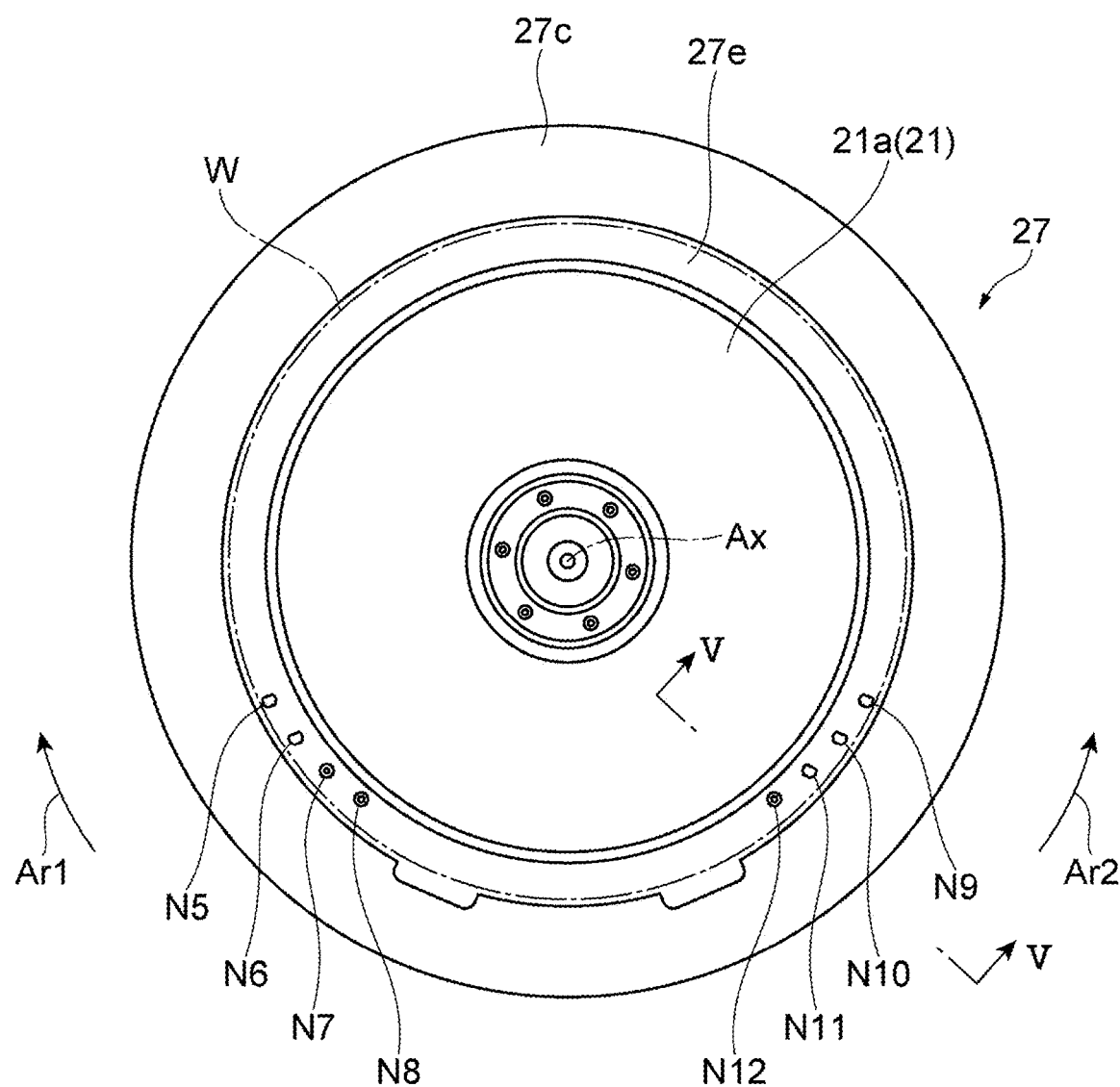
FIG. 3 is a plan view illustrating a rotation holding part and a cup.

In the present embodiment, the rotation axis (Ax) passes through a center of the wafer (W) that has a circular shape, and thus is also a central axis of the wafer (W). In the present embodiment, as illustrated in FIG. 3, the rotation holding part 21 rotates the wafer (W) at a predetermined rotation speed clockwise or counterclockwise as viewed from above. The rotation speed of the wafer (W) may be, for example, about 10 rpm-2000 rpm.

Figure 2:
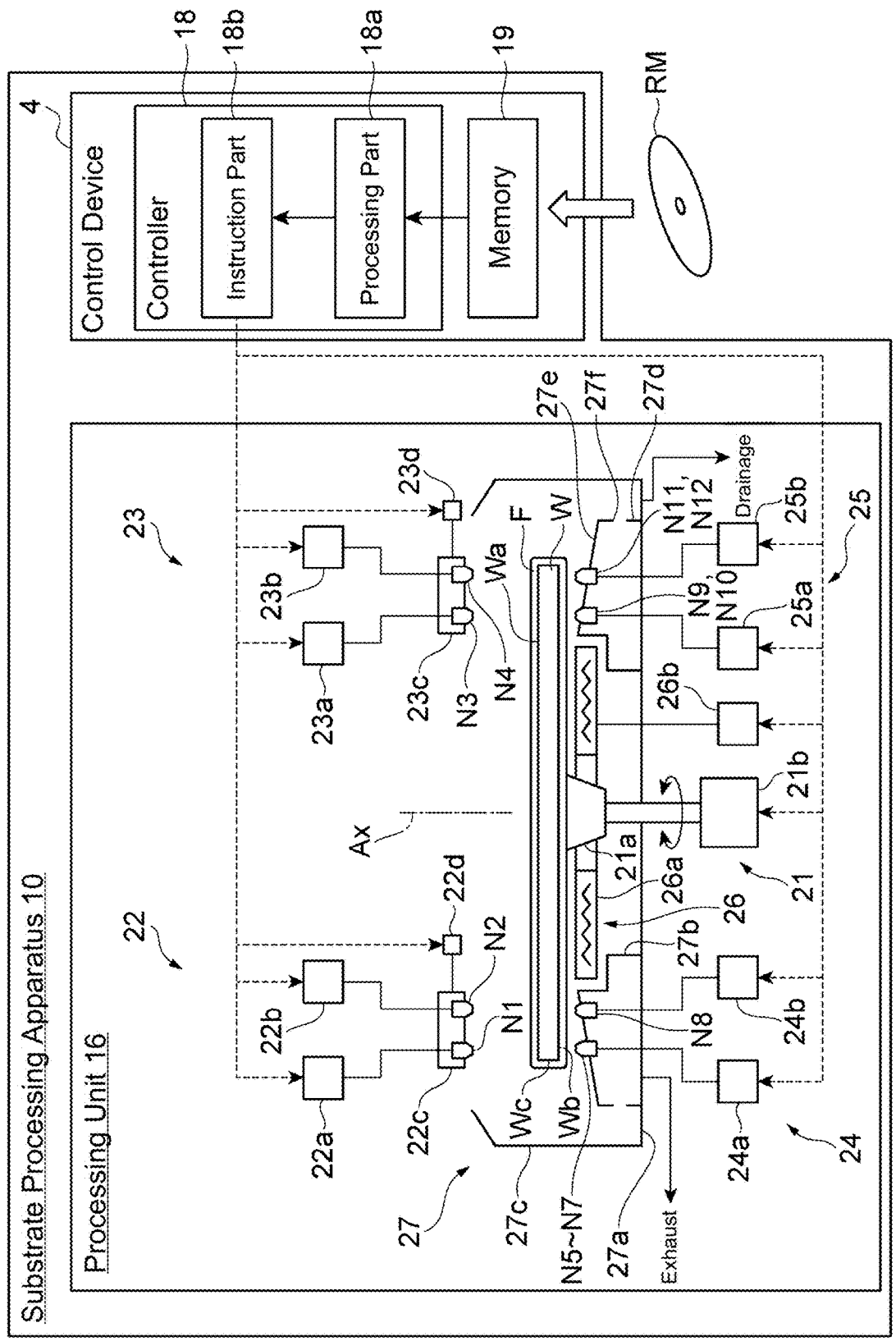
FIG. 2 illustrates a processing unit.

The liquid supply part 22 is structured to supply a chemical liquid and a rinse liquid to a peripheral edge portion (Wc) of the surface (Wa) of the wafer (W) at a predetermined processing position (in FIG. 2, on a left side of the rotation holding part 21 and above the peripheral edge portion (Wc) of the wafer (W)). The liquid supply part 22 includes a chemical liquid source (22a), a rinse liquid source (22b), a nozzle unit (22c) that holds nozzles (N1, N2), and a drive mechanism (22d).

The chemical liquid source (22a) operates based on an operation signal from the control device 4 and supplies to the nozzle (N1) a chemical liquid for dissolving the film (F). Therefore, a chemical liquid is discharged from the nozzle (N1) to the surface (Wa) side of the wafer (W). The chemical liquid source (22a) may include, for example, a chemical liquid tank, a pump pumping a chemical liquid from the chemical liquid tank, and a valve controlling ON/OFF of a flow of the chemical liquid (the chemical liquid tank, the pump and the valve are not illustrated in the drawings).

Examples of the chemical liquid include alkaline chemical liquids, acidic chemical liquids, and the like. Examples of the alkaline chemical liquids include an SC-1 solution (mixed solution of ammonia, hydrogen peroxide and pure water), a hydrogen peroxide solution, and the like. Examples of the acidic chemical liquids include an SC-2 solution (mixed solution of hydrochloric acid, hydrogen peroxide and pure water), an HF solution (hydrofluoric acid), a DHF solution (diluted hydrofluoric acid), an $HNO_3$+HF solution (mixed solution of nitric acid and hydrofluoric acid), and the like.

The rinse liquid source (22b) operates based on an operation signal from the control device 4 and supplies to the nozzle (N2) a rinse liquid for washing away the chemical liquid and dissolved components of the film (F). Therefore, a rinse liquid is discharged from the nozzle (N2) to the surface (Wa) side of the wafer (W). The rinse liquid source (22b) may include, for example, a rinse liquid tank, a pump pumping a rinse liquid from the rinse liquid tank, and a valve controlling ON/OFF of a flow of the rinse liquid (the rinse liquid tank, the pump and the valve are not illustrated in the drawings).

Examples of the rinse liquid include pure water (deionized water (DIW)) and the like.

The drive mechanism (22d) operates based on an operation signal from the control device 4 and moves the nozzle unit (22c) in a horizontal direction (radial direction of the wafer (W)).

The liquid supply part 23 is structured to supply a chemical liquid and a rinse liquid to the peripheral edge portion (Wc) of the surface (Wa) of the wafer (W) at a predetermined processing position (in FIG. 2, on a right side of the rotation holding part 21 and above the peripheral edge portion (Wc) of the wafer (W)). The liquid supply part 23 includes a chemical liquid source (23a), a rinse liquid source (23b), a nozzle unit (23c) that holds nozzles (N3, N4), and a drive mechanism (23d). The chemical liquid source (23a), the rinse liquid source (23b), the nozzle unit (23c) and the drive mechanism (23d) respectively have the same structures as those of the chemical liquid source (22a), the rinse liquid source (22b), the nozzle unit (22c) and the drive mechanism (22d), and thus, descriptions thereof are omitted.

However, in the present embodiment, a chemical liquid is discharged from the nozzle (N3) to the surface (Wa) side of the wafer (W), and a rinse liquid is discharged from the nozzle (N4) to the surface (Wa) side of the wafer (W).

The liquid supply part 24 is structured to supply a chemical liquid and a rinse liquid to a peripheral edge portion (Wc) of a back surface (Wb) of the wafer (W) at a predetermined processing position (in FIG. 2, on a left side of the rotation holding part 21 and below the peripheral edge portion (Wc) of the wafer (W)). The liquid supply part 24 includes a chemical liquid source (24a), a rinse liquid source (24b), and nozzles (N5-N8).

The chemical liquid source (24a) operates based on an operation signal from the control device 4 and supplies to the nozzles (N5-N7) (chemical liquid nozzles) a chemical liquid for dissolving the film (F). Therefore, a chemical liquid is discharged from the nozzles (N5-N7) to the back surface (Wb) side of the wafer (W). The chemical liquid source (24a) may include, for example, a chemical liquid tank, a pump pumping a chemical liquid from the chemical liquid tank, and a valve controlling ON/OFF of a flow of the chemical liquid (the chemical liquid tank, the pump and the valve are not illustrated in the drawings).

The rinse liquid source (24b) operates based on an operation signal from the control device 4 and supplies to the nozzle (N8) (rinse liquid nozzle) a rinse liquid for washing away the chemical liquid and dissolved components of the film (F). Therefore, a rinse liquid is discharged from the nozzle (N8) to the back surface (Wb) side of the wafer (W). The rinse liquid source (24b) may include, for example, a rinse liquid tank, a pump pumping a rinse liquid from the rinse liquid tank, and a valve controlling ON/OFF of a flow of the rinse liquid (the rinse liquid tank, the pump and the valve are not illustrated in the drawings).

The liquid supply part 25 is structured to supply a chemical liquid and a rinse liquid to the peripheral edge portion (Wc) of the back surface (Wb) of the wafer (W) at a predetermined processing position (in FIG. 2, on a right side of the rotation holding part 21 and below the peripheral edge portion (Wc) of the wafer (W)). The liquid supply part 25 includes a chemical liquid source (25a), a rinse liquid source (25b), and nozzles (N9-N12). The chemical liquid source (25a), the rinse liquid source (25b) and the nozzles (N9-N12) respectively have the same structures as those of the chemical liquid source (24a), the rinse liquid source (24b) and the nozzles (N5-N8), and thus, descriptions thereof are omitted. However, in the present embodiment, a chemical liquid is discharged from the nozzles (N9, N10) (chemical liquid nozzles) to the back surface (Wb) side of the wafer (W), and a rinse liquid is discharged from the nozzles (N11, N12) (rinse liquid nozzles) to the back surface (Wb) side of the wafer (W).

The temperature adjustment part 26 is structured to operate based on an operation signal from the control device 4 and to heat the wafer (W). The temperature adjustment part 26 includes a main body (26a) and a gas source (26b). A heating source such as a resistance heating heater is embedded in the main body (26a). The main body (26a) has an annular shape and surrounds the rotation holding part 21. Therefore, in a state in which the wafer (W) is held by the rotation holding part 21, the main body (26a) is positioned on the back surface (Wb) side of the wafer (W).

The gas source (26b) supplies an inert gas such as a nitrogen gas to the main body (26a). The inert gas supplied from the gas source (26b) into the main body (26a) is heated by the heating source in the main body (26a) and then is blown from a discharge port of the main body (26a) toward the back surface (Wb) of the wafer (W). As a result, the wafer (W) is maintained at a predetermined temperature (for example, 50° C.-80° C.). Therefore, the removal process of the film (F) by the chemical liquid supplied to the wafer (W) is promoted.

Figure 5:
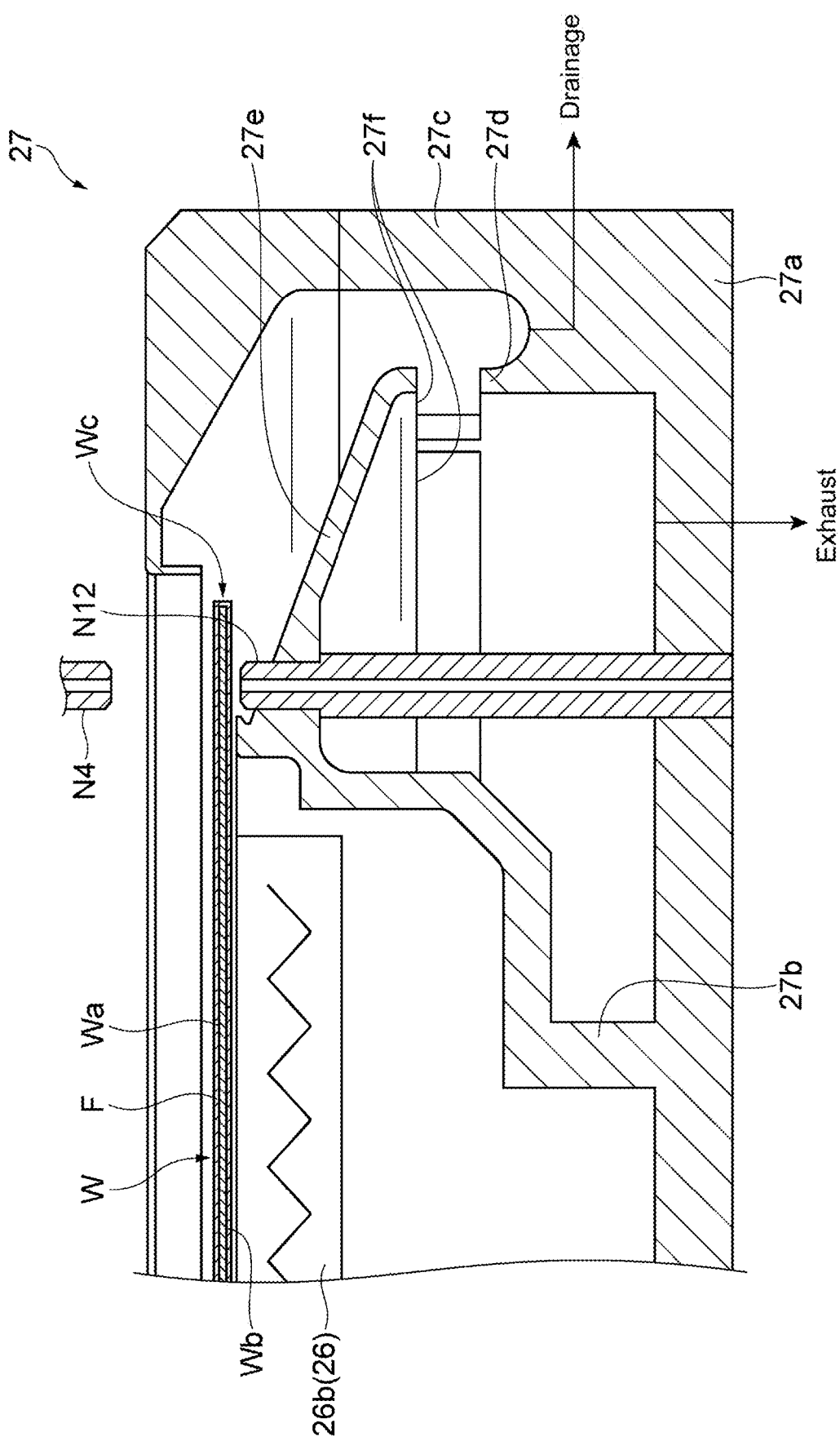
FIG. 5 is a cross-sectional view along a V-V line of FIG. 3.

The cup 27 has a function of receiving the chemical liquids and the rinse liquids supplied from the liquid supply parts (22-25) (nozzles (N1-N12)), As illustrated in FIGS. 2, 3 and 5, the cup 27 is formed by a bottom wall (27a), an inner peripheral wall (27b), an outer peripheral wall (27c), a partition wall (27d), and an inclined wall (27e).

The bottom wall (27a) has an annular shape surrounding the rotation holding part 21. The bottom wall (27a) is positioned below the temperature adjustment part 26. The inner peripheral wall (27b) has a stepped cylindrical shape surrounding the temperature adjustment part 26. The inner peripheral wall (27b) extends upward from an upper surface of the bottom wall (27a).

The outer peripheral wall (27c) has a cylindrical shape surrounding the wafer (W) held by the rotation holding part 21 and the inner peripheral wall (27b). The outer peripheral wall (27c) extends upward from an outer peripheral edge of the bottom wall (27a). An inner wall surface of the outer peripheral wall (27c) on an upper end side is inclined toward an inner side (the rotation holding part 21 side) as the inner wall surface extends upward.

The partition wall (27d) has a cylindrical shape and extends upward from the upper surface of the bottom wall (27a). A height of the partition wall (27d) is smaller than a height of the inner peripheral wall (27b). The partition wall (27d) is positioned between the inner peripheral wall (27b) and the outer peripheral wall (27c) and on an outer side of the peripheral edge portion (Wc) of the wafer (W) held by the rotation holding part 21. The partition wall (27d) is provided with multiple through holes (27f) aligned along a circumferential direction of the partition wall (27d).

A drain pipe (not illustrated in the drawings) is connected to a region of the bottom wall (27a) between the outer peripheral wall (27c) and the partition wall (27d). The chemical liquids and the rinse liquids supplied from the liquid supply parts (22-25) (nozzles (N1-N12)) is drained to the outside from the drain pipe. An exhaust pipe (not illustrated in the drawings) is connected to a region of the bottom wall (27a) between the inner peripheral wall (27b) and the partition wall (27d). The down flow formed by the air blower flows into a space surrounded by the bottom wall (27a), the inner peripheral wall (27b), the partition wall (27d) and the inclined wall (27e), and is exhausted to the outside from the exhaust pipe.

The inclined wall (27e) connects an upper end of the inner peripheral wall (27b) and an upper end of the partition wall (27d). Therefore, the inclined wall (27e) is inclined downward as extending outward. A region of the inclined wall (27e) on the rotation holding part 21 side faces a region of the back surface (Wb) on the peripheral edge portion (Wc) side of the wafer (W) held by the rotation holding part 21. A region of the inclined wall (27e) on the outer peripheral wall (27c) side is positioned on an outer side of the wafer (W) held by the rotation holding part 21.

Figure 4A:
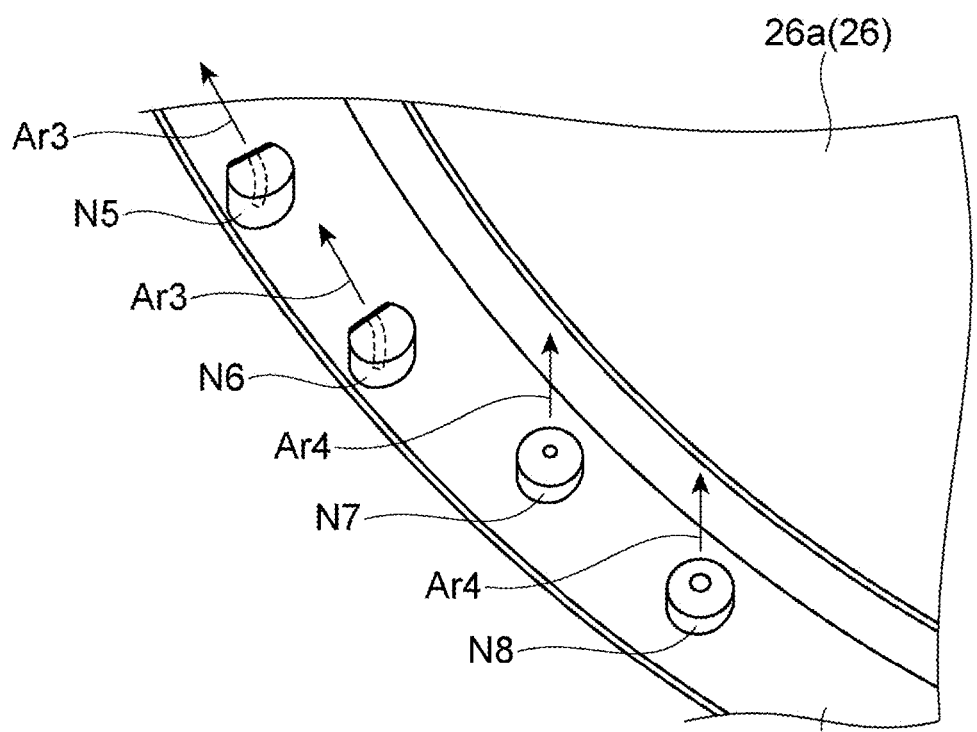
FIG. 4A is a perspective view illustrating nozzles positioned on a left side of the cup.

The nozzles (N5-N12) are attached to the inclined wall (27e). Specifically, the nozzles (N5-N8) are positioned in the inclined wall (27e) on a lower left side of the rotation holding part 21 in FIG. 3. The nozzles (N5-N8) are used when the wafer (W) rotates in a positive rotation direction (Ar1) (first direction), which is clockwise when viewed from above. As illustrated in FIGS. 3 and 4A, discharge ports of the nozzles (N5, N6) open obliquely upward (in an arrow (Ar3) direction in FIG. 4A) toward a downstream side (upper left side in FIG. 3) with respect to a positive rotation direction (Ar1). Discharge ports of the nozzles (N7, N8) open vertically upward (in an arrow (Ar4) direction in FIG. 4A).

The nozzles (N5-N8) are positioned in this order from a downstream side to an upstream side with respect to the positive rotation direction (Ar1). Therefore, the nozzle (N8) is positioned near the nozzles (N5-N7) on an upstream side of the nozzles (N5-N7) with respect to the positive rotation direction (Ar1). The nozzles (N7, N8) are positioned closer to the rotation axis (Ax) than the nozzles (N5, N6) are in the radial direction of the wafer (W).

Figure 4B:
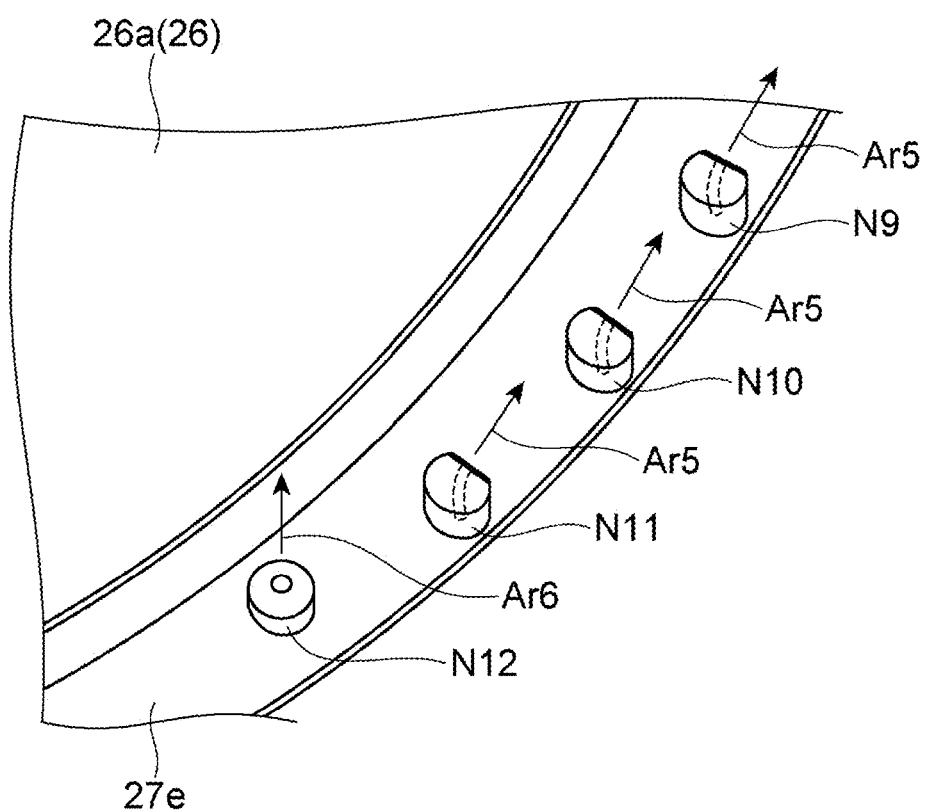
FIG. 4B is a perspective view illustrating nozzles positioned on a right side of the cup.

The nozzles (N9-N12) are positioned in the inclined wall (27e) on a lower right side of the rotation holding part 21 in FIG. 3. As illustrated in FIGS. 3 and 4B, the nozzles (N9-N12) are used when the wafer (W) rotates in a reverse rotation direction (Ar2) (second direction), which is counterclockwise when viewed from above. Discharge ports of the nozzles (N9-N11) open obliquely upward (in an arrow (Ar5) direction in FIG. 4B) toward a downstream side (upper right side in FIG. 3) with respect to a reverse rotation direction (Ar2). A discharge port of the nozzle (N12) opens vertically upward (in an arrow (Ar6) direction in FIG. 4B).

The nozzles (N9-N12) are positioned in this order from a downstream side to an upstream side with respect to the reverse rotation direction (Ar2) (second direction). Therefore, the nozzles (N11, N12) are positioned near the nozzles (N9, N10) on an upstream side of the nozzles (N9, N10) with respect to the reverse rotation direction (Ar2). The nozzle (N12) is positioned closer to the rotation axis (Ax) than the nozzles (N9-N11) are in the radial direction of the wafer (W).

Controller

As illustrated in FIG. 2, the controller 18 includes a processing part (18a) and an instruction part (18b) as functional modules. The processing part (18a) processes various data. The processing part (18a) generates an operation signal for operating the processing unit 16 (for example, the rotation holding part 21, the liquid supply part (22-25), the temperature adjustment part 26 and the like) based the program stored in the memory 19 by reading, for example, from a recording medium (RM). The instruction part (18b) transmits the operation signal generated by the processing part (18a) to various devices. In the present specification, the computer readable recording medium includes non-transitory tangible medium (non-transitory computer recording medium) (for example, various main storage devices or auxiliary storage devices) and propagated signals (transitory computer recording medium) (for example, data signals that can be provided over a network).

In the present embodiment, the substrate processing apparatus 10 is provided with one control device 4. However, it is also possible that the substrate processing apparatus 10 is provided with a controller group (controller) including multiple control devices 4. When the substrate processing apparatus 10 is provided with a controller group, the above-described functional modules may each be realized by one control device 4 or a combination of two or more control devices 4. When the control device 4 is formed using multiple computers (circuits (4A)), the above-described functional modules may each be realized by one computer (circuit (4A)) or a combination of two or more computers (circuits (4A)). The control device 4 may have multiple processors (4B). In this case, the above-mentioned functional modules may each be realized by one processor (4B) or a combination of two or more processors (4B).

Wafer Processing Method

A method for processing the wafer (W) by the processing unit 16 is described with reference to FIGS. 6 and 7A-7C. First, the control device 4 controls the rotation holding part 21 to hold the wafer (W) in the rotation holding part 21 (see process (S1) of FIG. 6).

The control device 4 controls the rotation holding part 21 to rotate the wafer (W) at a predetermined rotation speed in the reverse rotation direction (Ar2). The rotation speed in this case may be, for example, about several 10 rpm (for example, about 10 rpm)-about 3000 rpm, or about 1000 rpm. In this state, the control device 4 controls the liquid supply part 23 and the liquid supply part 25 to supply a chemical liquid from the nozzle (N3) to the surface (Wa) of the wafer (W) and to supply a chemical liquid from one of the nozzles (N9, N10) to the back surface (Wb) of the wafer (W) (see process (S2) of FIG. 6). Flow rates of the chemical liquids may be, for example, about 10 ml/sec-50 ml/sec, or about 10 ml/sec. Supply times of the chemical liquids can be set to various values according to a thickness of the film (F), and may be, for example, about 5 seconds-300 seconds, or about 30 seconds. As a result, the film (F) is removed from the peripheral edge portion (Wc) and regions near the peripheral edge portion (Wc) of the surface (Wa) and the back surface (Wb) of the wafer (W). In this case, chemical liquids of the same kind or different kinds may be supplied from the nozzles (N9, N10).

The control device 4 controls the rotation holding part 21 to rotate the wafer (W) at a predetermined rotation speed in the reverse rotation direction (Ar2). The rotation speed in this case may be, for example, about several 10 rpm (for example, about 10 rpm)-about 3000 rpm, or about 1000 rpm. In this state, the control device 4 controls the liquid supply part 23 and the liquid supply part 25 to supply a rinse liquid from the nozzle (N4) to the surface (Wa) of the wafer (W) and to supply a rinse liquid from at least one of the nozzles (N11, N12) to the back surface (Wb) of the wafer (W) (see process (S3) of FIG. 6). Flow rates of the rinse liquids may be, for example, about 10 ml/sec-100 ml/sec, or about 10 ml/sec. Supply times of the rinse liquids may be, for example, about 5 seconds-60 seconds, or about 30 seconds. As a result, rinse of the wafer (W) is performed.

The control device 4 controls the rotation holding part 21 to rotate the wafer (W) at a predetermined rotation speed in the reverse rotation direction (Ar2). In this state, the control device 4 controls the liquid supply part 23 and the liquid supply part 25 to supply a rinse liquid from the nozzle (N4) to the surface (Wa) of the wafer (W) and to supply a rinse liquid from at least one of the nozzles (N11, N12) to the back surface (Wb) of the wafer (W) (see process (S4) of FIG. 6). Flow rates of the rinse liquids may be, for example, about 10 ml/sec-100 ml/sec. Supply times of the rinse liquids may be, for example, about 5 seconds-60 seconds, or about 30 seconds.

In this case, the control device 4 controls the rotation holding part 21 to vary the rotation speed of the wafer (W) during a period from the start of the supply to the end of the supply of the rinse liquids. The rotation speed of the wafer (W) at the start of the supply of the rinse liquids may be, for example, about 10 rpm-100 rpm. The rotation speed of the wafer (W) at the end of the supply of the rinse liquids may be, for example, about 1000 rpm-3000 rpm, or about 2000 rpm. During the period from the start of the supply to the end of the supply of the rinse liquids, a rotational acceleration of the wafer (W) may be, for example, about 10 rpm/sec-100 rpm/sec, or about 50 rpm/sec.

Figure 7A:
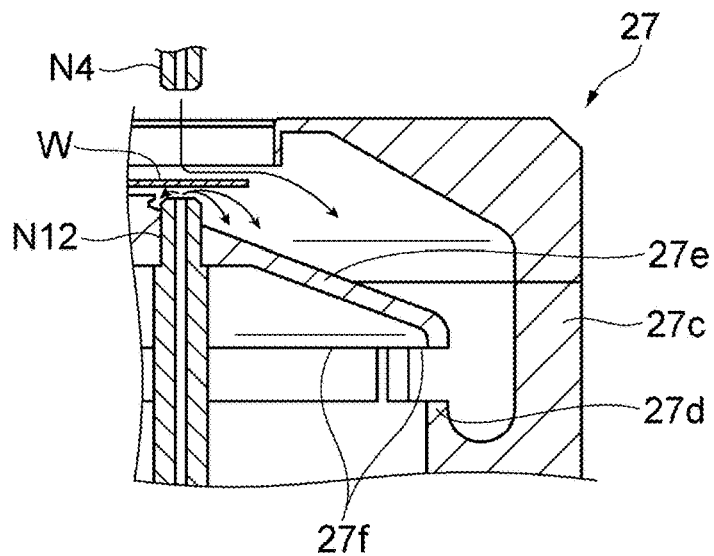
FIG. 7A-7C schematic diagrams for describing the rinse processing processes.

In this case, the wafer (W) is rotating at a low rotation speed at the beginning of the supply of the rinse liquids. Therefore, a centrifugal force acting on a rinse liquid (rebound liquid) that is supplied to the back surface (Wb) of the wafer (W) from the at least one of the nozzles (N11, N12) and is bounded back is not so strong. Therefore, as illustrated in FIG. 7A, the rebound liquid falls to near the nozzles (N11, N12). Therefore, mainly, a region of the inclined wall (27e) on the rotation holding part 21 side is cleaned by the rinse liquids.

Figure 7B:
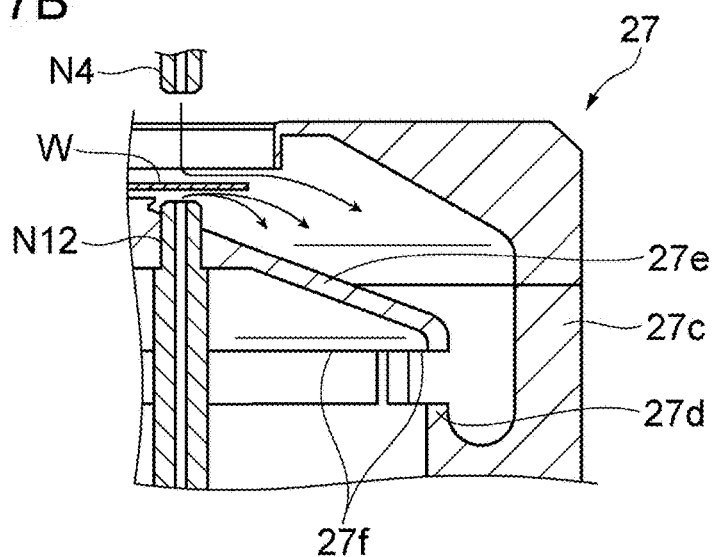

Thereafter, as the rotation speed of the wafer (W) increases, the centrifugal force acting on the rinse liquid supplied to the back surface (Wb) of the wafer (W) increases. Therefore, as illustrated in FIG. 7B, the rinse liquid falls to a position away from the nozzles (N11, N12) in the radial direction of the wafer (W). Therefore, mainly, a region of the inclined wall (27e) on the outer peripheral wall (27c) side and a lower side region of the inner wall surface of the outer peripheral wall (27c) are cleaned by the rinse liquid.

Figure 7C:
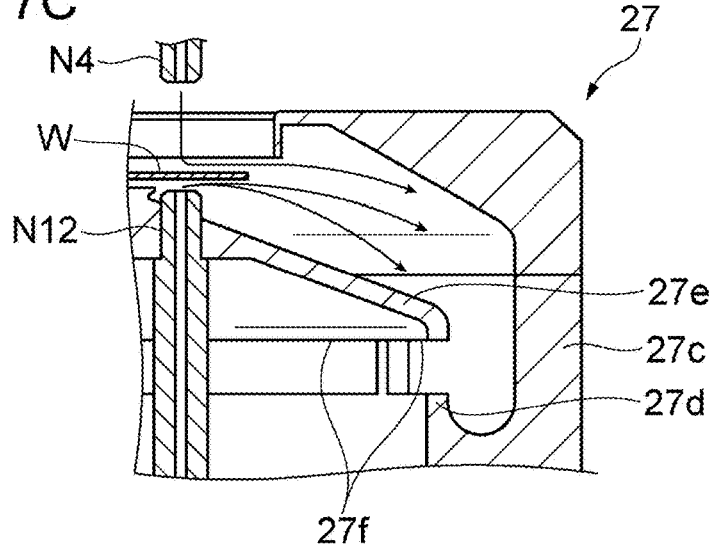

Thereafter, when the rotation speed of the wafer (W) further increases and the supply of the rinse liquid approaches the end, the wafer (W) rotates at a high rotation speed. Therefore, a large centrifugal force acts on the rinse liquid supplied to the back surface (Wb) of the wafer (W). Therefore, as illustrated in FIG. 7C, the rinse liquid is shaken off from a vicinity of an outer peripheral edge of the wafer (W) and reaches the inner wall surface of the outer peripheral wall (27c). Therefore, mainly, an upper side region of the inner wall surface of the outer peripheral wall (27c) is cleaned by the rinse liquid (shaken off liquid) shaken off from the wafer (W). As a result, a wide area in the cup 27 is cleaned by rinse liquid.

Next, the control device 4 controls the rotation holding part 21 to rotate the wafer (W) at a predetermined rotation speed in the positive rotation direction (Ar1). The rotation speed in this case may be, for example, about several 10 rpm (for example, about 10 rpm)-about 3000 rpm, or about 1000 rpm. In this state, the control device 4 controls the liquid supply part 23 and the liquid supply part 25 to supply a rinse liquid from the nozzle (N4) to the surface (Wa) of the wafer (W) and to supply a rinse liquid from at least one of the nozzles (N11, N12) to the back surface (Wb) of the wafer (W) (see process (S5) of FIG. 6). Flow rates of the rinse liquids may be, for example, about 10 ml/sec-50 ml/sec, or about 10 ml/sec. Supply times of the rinse liquids may be, for example, about 5 seconds-60 seconds, or about 30 seconds. As a result, rinse of the wafer (W) is performed again.

The control device 4 controls the rotation holding part 21 to rotate the wafer (W) at a predetermined rotation speed in the positive rotation direction (Ar1). In this state, the control device 4 controls the liquid supply part 23 and the liquid supply part 25 to supply a rinse liquid from the nozzle (N4) to the surface (Wa) of the wafer (W) and to supply a rinse liquid from at least one of the nozzles (N11, N12) to the back surface (Wb) of the wafer (W) (see process (S6) of FIG. 6). Flow rates of the rinse liquids may be, for example, about 10 ml/sec-100 ml/sec. Supply times of the rinse liquids may be, for example, about 5 seconds-60 seconds, or about 30 seconds.

Also in this case, the control device 4 controls the rotation holding part 21 to vary the rotation speed of the wafer (W) during a period from the start of the supply to the end of the supply of the rinse liquids. The rotation speed of the wafer (W) at the start of the supply of the rinse liquids may be, for example, about several 10 rpm-3000 rpm, or about 10 rpm.

The rotation speed of the wafer (W) at the end of the supply of the rinse liquids may be, for example, about 1000 rpm-3000 rpm, or about 2000 rpm. During the period from the start of the supply to the end of the supply of the rinse liquids, a rotational acceleration of the wafer (W) may be, for example, about 10 rpm/sec-100 rpm/sec, or about 50 rpm/sec. As a result, a wide area in the cup 27 is cleaned by rinse liquid.

It is also possible that, by the same processes as the above-described processes (S2-S6), a chemical liquid and a rinse liquid are supplied from the liquid supply parts (22, 24) to the wafer (W) while the wafer (W) is rotated in the positive rotation direction (Ar1). Either the process of supplying the chemical liquid and the rinse liquid to the wafer (W) when the wafer (W) rotates in the positive rotation direction (Ar1), or the process of supplying the chemical liquid and the rinse liquid to the wafer (W) when the wafer (W) rotates in the reverse rotation direction (Ar2), may be performed first.

The control device 4 controls the rotation holding part 21 to rotate the wafer (W) at a predetermined rotation speed (see process (S7) of FIG. 6). The rotation speed in this case may be, for example, about several 10 rpm (for example, about 10 rpm)-about 3000 rpm, or about 2000 rpm. The rotation direction in this case may be the positive rotation direction (Ar1) or the reverse rotation direction (Ar2). As a result, drying of the wafer (W) is performed. Thus, the processing of the wafer (W) is completed.

In the present embodiment as described above, the rotation speed of the wafer (W) varies between the low rotation speed and the high rotation speed. Therefore, during the variation of the rotation speed, when the rinse liquid is supplied to the peripheral edge portion (Wc) of the back surface (Wb), along with the variation of the centrifugal force acting on the rinse liquid, the position at which the rinse liquid supplied to the back surface (Wb) of the wafer (W) reaches the cup 27 from the back surface (Wb) varies. For example, along with the variation of the rotation speed of the wafer (W), the position at which the rebound liquid or the shaken off liquid or the like reaches the inclined wall (27e) or reaches the outer peripheral wall (27c) varies. Therefore, while the wafer (W) is rinsed with the rinse liquid, a wide area in the cup 27 is cleaned by the rinse liquid supplied to the back surface (Wb) of the wafer (W). Therefore, it is possible to effectively clean the inside of the cup 27 while efficiently processing the wafer (W).

Specifically, when the wafer (W) rotates at a low rotation speed, the rinse liquid (rebound liquid), which is supplied to the back surface (Wb) of the wafer (W) and is bounced back, reaches a peripheral region of the rinse liquid nozzle. The peripheral region is a region of the inclined wall (27e) that is hidden by the wafer (W) in a plan view (see FIG. 3), and is a region that is hard to be reached by a rinse liquid and is difficult to be cleaned. Therefore, according to the present embodiment, it is possible to effectively clean the peripheral region that is difficult to be cleaned.

On the other hand, when the wafer (W) rotates at a high rotation speed, the rinse liquid (shaken off liquid) (which is supplied to the back surface (Wb) of the wafer (W) and is shaken off) falls to or collides with a region on an outer side of the peripheral region. The outer side region is, for example, a region of the inclined wall (27e) that is not hidden by the wafer (W) in a plan view (see FIG. 3), and is a lower side region of the inner wall surface of the outer peripheral wall (27c) (see FIG. 5). Since the rinse liquid is supplied to the wafer (W) rotating at a relatively high rotation speed, a relatively large centrifugal force acts on the shaken off liquid. Therefore, the shaken off liquid reaches the outer side region with a relatively large kinetic energy and thus a high cleaning effect is obtained in the outer side region.

In the present embodiment, the rotation speed of the wafer (W) is gradually varied from a low rotation speed to a high rotation speed at a predetermined acceleration. Therefore, the position at which the rebound liquid reaches the cup 27 moves in a certain direction. Therefore, the rinse liquid supplied to the back surface (Wb) of the wafer (W) is likely to be uniformly supplied into the cup 27. As a result, it is possible to more effectively clean the inside of the cup 27.

In the present embodiment, first, the peripheral edge portion (Wc) of the wafer (W) is rinsed at a predetermined rotation speed (processes (S2, S5)). Thereafter, the rotation speed of the wafer (W) is varied from a low rotation speed lower than the rotation speed at the rinse processing of the wafer (W) to a high rotation speed. Therefore, first, the back surface (Wb) of the wafer (W) is cleaned with a rinse liquid, and thereafter, in a process in which the rotation speed of the wafer (W) varies from a low rotation speed to a high rotation speed, the inside of the cup 27 is cleaned. Therefore, both the wafer (W) and the cup 27 can be cleaned in a series of rinse processes. As a result, it is possible to effectively clean the inside of the cup 27 while efficiently processing the wafer (W).

In the present embodiment, the rotation speed of the wafer (W) is varied between a low rotation speed and a high rotation speed, and further, the rotation direction of the wafer (W) is varied between the positive rotation direction (Ar1) and the reverse rotation direction (Ar2). Therefore, since the rotation direction of the wafer (W) is varied, the rinse liquid supplied to the back surface (Wb) of the wafer (W) is likely to spread within the cup 27 in a circumferential direction of the wafer (W). Therefore, it is possible to further efficiently clean the inside of the cup 27.

In the present embodiment, the nozzle (N8), which functions as a rinse liquid nozzle, is positioned near the nozzles (N5-N7), which function as chemical liquid nozzles, on an upstream side of the nozzles (N5-N7) with respect to the positive rotation direction (Ar1). Similarly, the nozzles (N11, N12), which function as rinse liquid nozzles, are positioned near the nozzles (N9, N10), which function as chemical liquid nozzles, on an upstream side of the nozzles (N9, N10) with respect to the reverse rotation direction (Ar2). Therefore, even when the chemical liquid adheres to the wafer (W), the chemical liquid is washed away by the rinse liquid from the upstream side. Therefore, it is possible to effectively clean the wafer (W).

In the present embodiment, the nozzle (N8), which functions as a rinse liquid nozzle, is positioned closer to the rotation holding part 21 than the nozzles (N5, N6), which function as chemical liquid nozzles, are. Similarly, the nozzles (N11, N12) (which function as rinse liquid nozzles) are positioned closer to the rotation holding part 21 than the nozzles (N9, N10) (which function as chemical liquid nozzles) are. Therefore, a region of the wafer (W) closer to the rotation holding part 21 can also be cleaned by the rinse liquids discharged from the nozzles (N8, N11, N12). Therefore, it is possible to more effectively clean the wafer (W).

Other Embodiments

In the above, embodiments of the present invention are described in detail. However, within the scope of the spirit of the present invention, various modifications may be added to the above-described embodiments. For example, the rotation speed of the wafer (W) may be varied between a low rotation speed and a high rotation speed. That is, the rotation speed of the wafer (W) may be varied, for example, from a low rotation speed to a high rotation speed, or from a high rotation speed to a low rotation speed, or from a low rotation speed to a high rotation speed and then again to a low rotation speed.

The rotation speed of the wafer (W) may gradually vary at a predetermined acceleration, or may vary stepwise, or irregularly.

The rotation direction of the wafer (W) may be only one of the positive rotation direction (Ar1) and the reverse rotation direction (Ar2).

It is also possible that the rinse processes of the wafer (W) at the processes (S3, S5) are not performed.

The positions of the nozzles (N5-N12) are not limited to the positions described in the present embodiment described above.

It is also possible that an organic solvent as a rinse liquid is discharged from the nozzles (N2, N4, N8, N11, N12) that function as the rinse liquid nozzles. In this case, it is possible to clean the wafer (W) and the inside of the cup 27 even when the chemical liquid contains a water insoluble component.

During the drying process of the wafer (W) at the process (S7), it is also possible that an organic solvent (for example, isopropyl alcohol) is discharged from the nozzles (N2, N4, N8, N11, N12) that function as the rinse liquid nozzles. In this case, since the drying of the wafer (W) is promoted by volatilization of IPA, occurrence of a watermark can be suppressed.

Depending on types of adhered substances adhering to the peripheral edge portion of the substrate or a type of a chemical liquid supplied to the peripheral edge portion of the substrate, there is a possibility that solid substances contained in the liquid adhere to the cup and accumulate. In this case, the solid substances accumulated in the cup become particles (foreign substances) and adhere to the substrate, which can lead to contamination of the apparatus. Therefore, the solid substances in the cup are removed by cleaning. However, the solid substances remaining in the cup are also present on the back surface side of the substrate, and there has been a demand for a method for effectively and efficiently cleaning the inside of the cup including the region on the back surface side of the substrate.

The present disclosure describes a substrate processing apparatus, a substrate processing method and a computer readable recording medium that allow the inside of the cup to be effectively cleaned while allowing the substrate to be efficiently processed.

A substrate processing apparatus according to one aspect of the present invention includes: a rotation holding part that holds and rotates a substrate; a liquid supply part having at least one rinse liquid nozzle that is structured to supply a rinse liquid to a peripheral edge portion of a back surface of the substrate and is positioned on the back surface side of the substrate; a cup on which the rinse liquid nozzle is attached and that receives the liquid supplied to the substrate; and a controller. In a state in which the substrate is positioned on an inner side of the cup, the controller controls the rotation holding part and the liquid supply part to perform a first process in which, while the rotation holding part varies a rotation speed of the substrate between a first rotation speed and a second rotation speed that is different from the first rotation speed, by supply the rinse liquid from the rinse liquid nozzle to the peripheral edge portion of the back surface, both a peripheral region of the rinse liquid nozzle in the cup and a region on an outer side of the peripheral region in the cup are cleaned using the rinse liquid supplied to the back surface.

A substrate processing method according to another aspect of the present invention includes a first process in which, in a state in which a substrate is positioned on an inner side of a cup, while the substrate is rotated about a rotation axis extending in a direction orthogonal to a surface of the substrate such that a rotation speed of the substrate varies between a first rotation speed and a second rotation speed that is different from the first rotation speed, by supplying a rinse liquid from a rinse liquid nozzle attached to the cup to a peripheral edge portion of a back surface of the substrate, both a peripheral region of the rinse liquid nozzle in the cup and a region on an outer side of the peripheral region in the cup are cleaned using the rinse liquid supplied to the back surface.

A substrate processing apparatus, a substrate processing method and a computer readable recording medium according to embodiments of the present invention can efficiently process a substrate and effectively clean the inside of the cup.

Obviously, numerous modifications and variations of the present invention are possible in light of the above teachings. It is therefore to be understood that within the scope of the appended claims, the invention may be practiced otherwise than as specifically described herein.

The invention claimed is:

1. A substrate processing apparatus, comprising:
a rotation holding device configured to hold and rotate a substrate;
a liquid supply device comprising a plurality of rinse liquid nozzles positioned on a back surface side of the substrate and configured to supply a rinse liquid to a peripheral edge portion of a back surface of the substrate;
a cup device comprising an inclined wall and configured to receive the rinse liquid supplied from the rinse liquid nozzles to the substrate such that the inclined wall is extending outward with respect to a rotation axis of the substrate and inclined downward away from the substrate and that the rinse liquid nozzles have a plurality of discharge ports projecting from a surface of the inclined wall; and
a control device comprising circuitry configured to control the rotation holding device and the liquid supply device and execute a first process in which, in a state in which the substrate is positioned on an inner side of the cup device, the rotation holding device varies a rotation speed of the substrate between a first rotation speed and a second rotation speed that is different from the first rotation speed, and the rinse liquid nozzles supply the rinse liquid to the peripheral edge portion of the back surface of the substrate from different directions such that the rinse liquid supplied to the back surface cleans peripheral regions of the rinse liquid nozzles on the inclined wall in the cup device and regions on an outer side of the peripheral regions in the cup device.

2. The substrate processing apparatus of claim 1, wherein the circuitry of the control device is configured control the rotation holding device and the liquid supply device such that, in the first process, the rotation holding device varies the rotation speed of the substrate from the first rotation speed to the second rotation speed at a rotation acceleration over a period of time, and the rinse liquid nozzles supply the rinse liquid to the peripheral edge portion of the back surface of the substrate.

3. The substrate processing apparatus of claim 1, wherein the circuitry of the control device is configured control the rotation holding device and the liquid supply device such that, in the first process, after the rotation holding device sets the rotation speed of the substrate to the first rotation speed, the rotation holding device varies the rotation speed of the substrate from the second rotation speed that is lower than the first rotation speed to a third rotation speed that is higher than the second rotation speed at a rotation acceleration over a period of time, and that in a process in which the rotation speed of the substrate is varied from the first rotation speed to the third rotation speed, the rinse liquid nozzles supply the rinse liquid to the peripheral edge portion of the back surface of the substrate.

4. The substrate processing apparatus of claim 1, wherein the circuitry of the control device is configured to control the rotation holding device and the liquid supply device such that, in the first process, the rotation holding device varies the rotation speed of the substrate between the first rotation speed and the second rotation speed, and further varies a rotation direction of the substrate between a first direction and a second direction that is opposite to the first direction, and the rinse liquid nozzles supply the rinse liquid to the peripheral edge portion of the back surface of the substrate.

5. The substrate processing apparatus of claim 1, wherein the circuitry of the control device is configured control the rotation holding device and the liquid supply device such that, in the first process, the rotation holding device rotates the substrate in a first direction and varies the rotation speed of the substrate from the first rotation speed to the second rotation speed at a rotation acceleration over a period of time, and the rinse liquid nozzles supply the rinse liquid to the peripheral edge portion of the back surface of the substrate, and that thereafter, the rotation holding device rotates the substrate in a second direction that is opposite to the first direction and varies the rotation speed of the substrate from the first rotation speed to the second rotation speed at a rotation acceleration over a period of time, and the rinse liquid is supplied from the rinse liquid nozzles to the peripheral edge portion of the back surface of the substrate.

6. The substrate processing apparatus of claim 1, wherein the circuitry of the control device is configured control the rotation holding device and the liquid supply device such that, in the first process, the rotation holding device rotates the substrate in a first direction and, after setting the rotation speed of the substrate to a first rotation speed, varies the rotation speed of the substrate from a second rotation speed that is lower than the first rotation speed to a third rotation speed that is higher than the second rotation speed at a rotation acceleration over a period of time, and in a process in which the rotation speed of the substrate is varied from the first rotation speed to the third rotation speed, the rinse liquid nozzles supply the rinse liquid to the peripheral edge portion of the back surface of the substrate, and that thereafter, the rotation holding device rotates the substrate in a second direction that is opposite to the first direction, and after setting the rotation speed of the substrate to a fourth rotation speed, the rotation holding device varies the rotation speed of the substrate from a fifth rotation speed that is lower than the fourth rotation speed to a sixth rotation speed that is higher than the fifth rotation speed at a rotation acceleration over a period of time, and in a process in which the rotation speed of the substrate is varied from the fourth rotation speed to the sixth rotation speed, the rinse liquid nozzles supply the rinse liquid to the peripheral edge portion of the back surface of the substrate.

7. The substrate processing apparatus of claim 1, wherein the circuitry of the control device is configured to set the first rotation speed to a value such that the rinse liquid supplied to the back surface of the substrate falls from the substrate to the peripheral regions.

8. The substrate processing apparatus of claim 1, wherein the liquid supply device further comprises a chemical liquid nozzle positioned on the back surface side of the substrate and configured to supply a chemical liquid to the peripheral edge portion of the back surface of the substrate, and the rinse liquid nozzles are positioned closer to a rotation center of the substrate than the chemical liquid nozzle.

9. The substrate processing apparatus of claim 1, wherein the circuitry of the control device is configured to control the rotation holding device and the liquid supply device and execute, after the first process, a second process in which the rotation holding device rotates the substrate, and the rinse liquid nozzles supply a second rinse liquid comprising an organic solvent to the peripheral edge portion of the back surface of the substrate.

10. The substrate processing apparatus of claim 2, wherein the circuitry of the control device is configured to control the rotation holding device and the liquid supply device such that, in the first process, the rotation holding device varies the rotation speed of the substrate between the first rotation speed and the second rotation speed and varies a rotation direction of the substrate between a first direction and a second direction that is opposite to the first direction, and the rinse liquid nozzles supply the rinse liquid to the peripheral edge portion of the back surface of the substrate.

11. A substrate processing method, comprising:
holding a substrate with a rotation holding device configured to hold and rotate the substrate; and
supplying a rinse liquid from a liquid supply device comprising a plurality of rinse liquid nozzles positioned on a back surface side of the substrate and configured to supply the rinse liquid to a peripheral edge portion of a back surface of the substrate,
wherein the rinse liquid nozzles have a plurality of discharge ports projecting from a surface of an inclined wall in a cup device configured to receive the rinse liquid supplied from the rinse liquid nozzles to the substrate, the supplying of the rinse liquid includes, in a state in which the substrate is positioned on an inner side of the cup device, rotating the substrate such that a rotation speed of the substrate is varied between a first rotation speed and a second rotation speed that is different from the first rotation speed, and supplying the rinse liquid from the rinse liquid nozzles attached to the cup device to the peripheral edge portion of the back surface of the substrate from different directions such that the rinse liquid supplied to the back surface of the substrate cleans peripheral regions of the rinse liquid nozzles on the inclined wall in the cup device and regions on an outer side of the peripheral regions in the cup device, and the inclined wall is extending outward with respect to a rotation axis of the substrate and inclined downward away from the substrate.

12. The substrate processing method of claim 11, wherein the supplying of the rinse liquid includes supplying the rinse liquid from the rinse liquid nozzles to the peripheral edge portion of the back surface of the substrate while varying the rotation speed of the substrate from the first rotation speed to the second rotation speed at a rotation acceleration over a period of time.

13. The substrate processing method of claim 11, wherein the supplying of the rinse liquid includes, after setting the rotation speed of the substrate to a first rotation speed, supplying the rinse liquid from the rinse liquid nozzles to the peripheral edge portion of the back surface of the substrate, while varying the rotation speed of the substrate from a second rotation speed that is lower than the first rotation speed to a third rotation speed that is higher than the second rotation speed at a rotation acceleration over a period of time, in a process in which the rotation speed of the substrate is varied from the first rotation speed to the third rotation speed.

14. The substrate processing method of claim 11, wherein the supplying of the rinse liquid includes supplying the rinse liquid from the rinse liquid nozzles to the peripheral edge portion of the back surface of the substrate, while varying the rotation speed of the substrate between the first rotation speed and the second rotation speed, and further varying a rotation direction of the substrate between a first direction and a second direction that is opposite to the first direction.

15. The substrate processing method of claim 11, wherein the supplying of the rinse liquid includes supplying the rinse liquid from the rinse liquid nozzles to the peripheral edge portion of the back surface of the substrate, while rotating the substrate in a first direction and varying the rotation speed of the substrate from the first rotation speed to the second rotation speed at a rotation acceleration over a period of time, and thereafter, supplying the rinse liquid from the rinse liquid nozzles to the peripheral edge portion of the back surface of the substrate, while rotating the substrate in a second direction that is opposite to the first direction and varying the rotation speed of the substrate from the first rotation speed to the second rotation speed at a rotation acceleration over a period of time.

16. The substrate processing method of claim 11, wherein the supplying of the rinse liquid includes, after setting the rotation speed of the substrate to a first rotation speed, supplying the rinse liquid from the rinse liquid nozzles to the peripheral edge portion of the back surface of the substrate, while rotating the substrate in a first direction and varying the rotation speed of the substrate from a second rotation speed that is lower than the first rotation speed to a third rotation speed that is higher than the second rotation speed at a rotation acceleration over a period of time, in a process in which the rotation speed of the substrate is varied from the first rotation speed to the third rotation speed at a rotation acceleration over a period of time, and thereafter, after setting the rotation speed of the substrate to a fourth rotation speed, supplying the rinse liquid from the rinse liquid nozzles to the peripheral edge portion of the back surface of the substrate, while rotating the substrate in a second direction that is opposite to the first direction and varying the rotation speed of the substrate from a fifth rotation speed that is lower than the fourth rotation speed to a sixth rotation speed that is higher than the fifth rotation speed at a rotation acceleration over a period of time, in a process in which the rotation speed of the substrate is varied from the fourth rotation speed to the sixth rotation speed.

17. The substrate processing method of claim 11, further comprising:
setting the first rotation speed to a value such that the rinse liquid supplied to the back surface of the substrate substantially falls from the substrate to the peripheral regions.

18. The substrate processing method of claim 11, further comprising:
supplying a chemical liquid from a chemical liquid nozzle to the peripheral edge portion of the back surface of the substrate,
wherein positions at which the rinse liquid nozzles supply the rinse liquid to the peripheral edge portion of the back surface of the substrate are closer to a rotation center of the substrate than a position at which the chemical liquid nozzle supplies the chemical liquid to the peripheral edge portion of the back surface of the substrate.

19. The substrate processing method of claim 11 further comprising:
after the supplying of the rinse liquid, supplying a second rinse liquid comprising an organic solvent from the rinse liquid nozzles to the peripheral edge portion of the back surface of the substrate while rotating the substrate.

20. A non-transitory computer readable recording medium stored thereon a program that when executed by an information processing apparatus, the information processing apparatus executes a substrate processing method comprising:
holding a substrate with a rotation holding device configured to hold and rotate the substrate; and
supplying a rinse liquid from a liquid supply device comprising a plurality of rinse liquid nozzles positioned on a back surface side of the substrate and configured to supply the rinse liquid to a peripheral edge portion of a back surface of the substrate,
wherein the rinse liquid nozzles have a plurality of discharge ports projecting from a surface of an inclined wall in a cup device configured to receive the rinse liquid supplied from the rinse liquid nozzles to the substrate, the supplying of the rinse liquid includes, in a state in which the substrate is positioned on an inner side of the cup device, rotating the substrate such that a rotation speed of the substrate is varied between a first rotation speed and a second rotation speed that is different from the first rotation speed, and supplying the rinse liquid from the rinse liquid nozzles attached to the cup device to the peripheral edge portion of the back surface of the substrate from different directions such that the rinse liquid supplied to the back surface of the substrate cleans peripheral regions of the rinse liquid nozzles and regions on an outer side of the peripheral regions in the cup device, and the inclined wall is extending outward with respect to a rotation axis of the substrate and inclined downward away from the substrate.

* * * * *